United States Patent
Mochizuki et al.

(10) Patent No.: US 11,482,612 B2
(45) Date of Patent: Oct. 25, 2022

(54) VERTICAL TRANSISTOR HAVING BOTTOM SPACERS ON SOURCE/DRAIN REGIONS WITH DIFFERENT HEIGHTS ALONG JUNCTION REGION

(71) Applicant: International Business Machines Corporation, Armonk, NY (US)

(72) Inventors: Shogo Mochizuki, Mechanicville, NY (US); Kangguo Cheng, Schenectady, NY (US); Juntao Li, Cohoes, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/136,852

(22) Filed: Dec. 29, 2020

(65) Prior Publication Data

US 2021/0119020 A1  Apr. 22, 2021

Related U.S. Application Data

(62) Division of application No. 16/102,110, filed on Aug. 13, 2018, now Pat. No. 10,930,758.

(51) Int. Cl.
*H01L 29/786* (2006.01)
*H01L 29/66* (2006.01)
(Continued)

(52) U.S. Cl.
CPC .. *H01L 29/66666* (2013.01); *H01L 21/02532* (2013.01); *H01L 21/2251* (2013.01);
(Continued)

(58) Field of Classification Search
CPC ........... H01L 27/2454; H01L 29/66666; H01L 29/7827; H01L 29/78642
See application file for complete search history.

(56) References Cited

U.S. PATENT DOCUMENTS 6,770,534 B2  8/2004  Cho et al.
6,773,994 B2  8/2004  Chittipeddi et al.
(Continued)

FOREIGN PATENT DOCUMENTS

KR  20090117793 A  11/2009

OTHER PUBLICATIONS

List of IBM Patents or Patent Applications Treated as Related.
(Continued)

*Primary Examiner* — Anh D Mai
(74) *Attorney, Agent, or Firm* — Randall Bluestone; Ryan, Mason & Lewis, LLP

(57) ABSTRACT

A method for manufacturing a semiconductor device includes forming a plurality of fins on a semiconductor substrate. In the method, sacrificial spacer layers are formed on the plurality of fins, and portions of the semiconductor substrate located under the sacrificial spacer layers and located at sides of the plurality of fins are removed. Bottom source/drain regions are grown in at least part of an area where the portions of the semiconductor substrate were removed, and sacrificial epitaxial layers are grown on the bottom source/drain regions. The method also includes diffusing dopants from the bottom source/drain regions and the sacrificial epitaxial layers into portions of the semiconductor substrate under the plurality of fins. The sacrificial epitaxial layers are removed, and bottom spacers are formed in at least part of an area where the sacrificial epitaxial layers were removed.

20 Claims, 13 Drawing Sheets

(51) Int. Cl.
  *H01L 21/8234* (2006.01)
  *H01L 21/02* (2006.01)
  *H01L 21/225* (2006.01)
  *H01L 21/8238* (2006.01)

(52) U.S. Cl.
  CPC ............ *H01L 21/823418* (2013.01); *H01L 21/823487* (2013.01); *H01L 21/823885* (2013.01); *H01L 29/6653* (2013.01); *H01L 29/6656* (2013.01); *H01L 29/66787* (2013.01); *H01L 29/78642* (2013.01)

(56) References Cited

U.S. PATENT DOCUMENTS

| | | | |
|---|---|---|---|
| 7,034,358 | B2 | 4/2006 | Bonart et al. |
| 7,683,482 | B2 | 3/2010 | Chidambarrao et al. |
| 9,502,519 | B2 | 11/2016 | Chen et al. |
| 9,530,700 | B1 | 12/2016 | Mallela et al. |
| 9,627,511 | B1 | 4/2017 | Cheng et al. |
| 9,741,626 | B1 | 8/2017 | Cheng et al. |
| 9,748,359 | B1 | 8/2017 | Gluschenkov et al. |
| 9,773,901 | B1 | 9/2017 | Gluschenkov et al. |
| 9,799,749 | B1 | 10/2017 | Bi et al. |
| 9,853,028 | B1 | 12/2017 | Cheng et al. |
| 9,870,957 | B2 | 1/2018 | Jeong et al. |
| 9,941,391 | B2 | 4/2018 | Gluschenkov et al. |
| 9,960,272 | B1 | 5/2018 | Bao et al. |
| 9,991,365 | B1 | 6/2018 | Cheng et al. |
| 9,997,413 | B1 | 6/2018 | Leobandung |
| 10,032,909 | B2 | 7/2018 | Cheng et al. |
| 10,157,798 | B1 | 12/2018 | Chi et al. |
| 10,170,582 | B1 | 1/2019 | Belyansky et al. |
| 10,229,985 | B1 | 3/2019 | Li et al. |
| 10,276,687 | B1 | 4/2019 | Bao et al. |
| 10,658,246 | B2 | 5/2020 | Zhang et al. |
| 10,749,011 | B2 | 8/2020 | Bi et al. |
| 2011/0012085 | A1 | 1/2011 | Deligianni et al. |
| 2013/0037879 | A1 | 2/2013 | Filippini et al. |
| 2018/0006024 | A1 | 1/2018 | Anderson et al. |
| 2018/0323281 | A1 | 11/2018 | Cheng et al. |

OTHER PUBLICATIONS

Disclosed Anonymously, "Method and Structure of Forming VFET Bottom Spacer and Replacement Gate," ip.com, IP.com No. IPCOM000250753D, Aug. 30, 2017, 9 pages.

100

100

100

VERTICAL TRANSISTOR HAVING BOTTOM SPACERS ON SOURCE/DRAIN REGIONS WITH DIFFERENT HEIGHTS ALONG JUNCTION REGION

In accordance with one or more embodiments of the present invention, a bottom spacer pattern for VFETs is formed using first and second bottom spacer formations. The first spacers of the bottom spacer pattern have flat profiles adjacent source/drain junction surfaces. More specifically, surfaces of the first spacers which are adjacent source/drain junction regions have a flat or planar profile. The flat profile of the first spacers is achieved by removing a sacrificial epitaxial layer from on top of a bottom source/drain layer, followed by deposition of a first spacer material. The deposition results in the first spacer material being pinched-off, resulting in first spacer material filling in open areas adjacent bottom source/drain junctions under lower portions of the fins. The pinched off areas of the first spacer material have a flat or planar profile adjacent bottom source/drain junction surfaces.

TECHNICAL FIELD

The field generally relates to semiconductor devices and methods of manufacturing same and, in particular, to forming vertical field effect transistors (VFETs) with bottom spacer patterns having spacers with a flat profile adjacent source/drain junctions.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

Bottom spacers in VFETs are typically formed by spacer deposition, including conformal and directional deposition, followed by isotropic etching to remove deposited portions not forming the spacer patterns. However, this scheme results in the bottom spacers having a concave meniscus-like shape at corners (e.g., upper corners) where the spacers abut source/drain junctions at bottom portions of the fins. The concave meniscus-like shape impacts deposition profiles of subsequently deposited high-K dielectric and work-function metal (WFM) layers, resulting in problems controlling bottom source/drain junctions and unwanted device variability.

SUMMARY

According to an exemplary embodiment of the present invention, a method for manufacturing a semiconductor device includes forming a plurality of fins on a semiconductor substrate. In the method, sacrificial spacer layers are formed on the plurality of fins, and portions of the semiconductor substrate located under the sacrificial spacer layers and located at sides of the plurality of fins are removed. Bottom source/drain regions are grown in at least part of an area where the portions of the semiconductor substrate were removed, and sacrificial epitaxial layers are grown on the bottom source/drain regions. The method also includes diffusing dopants from the bottom source/drain regions and the sacrificial epitaxial layers into portions of the semiconductor substrate under the plurality of fins. The sacrificial epitaxial layers are removed, and bottom spacers are formed in at least part of an area where the sacrificial epitaxial layers were removed.

According to an exemplary embodiment of the present invention, a semiconductor device includes a source/drain junction region on a semiconductor substrate. Bottom source/drain regions are disposed adjacent the source/drain junction region. The semiconductor device further includes a bottom spacer pattern including first bottom spacers disposed on lateral sides of the source/drain junction region, and second bottom spacers disposed on lateral sides of the first bottom spacers. The first and second bottom spacers are formed on top of the bottom source/drain regions. Top surfaces of first bottom spacers have a planar profile, and top surfaces of the second bottom spacers have a concave shape.

According to an exemplary embodiment of the present invention, a method for manufacturing a vertical transistor device includes forming a fin on a semiconductor substrate. In the method, sacrificial dielectric spacer layers are formed on the fin, and portions of the semiconductor substrate located under the sacrificial dielectric spacer layers and located at sides of the fin are removed. Doped bottom source/drain regions are formed in at least part of an area where the portions of the semiconductor substrate were removed, and doped sacrificial semiconductor layers are formed on the doped bottom source/drain regions. The method also includes diffusing dopants from the doped bottom source/drain regions and the doped sacrificial semiconductor layers into a portion of the semiconductor substrate under the fin. The doped sacrificial semiconductor layers are removed, and bottom spacers are formed in at least part of an area where the doped sacrificial semiconductor layers were removed.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
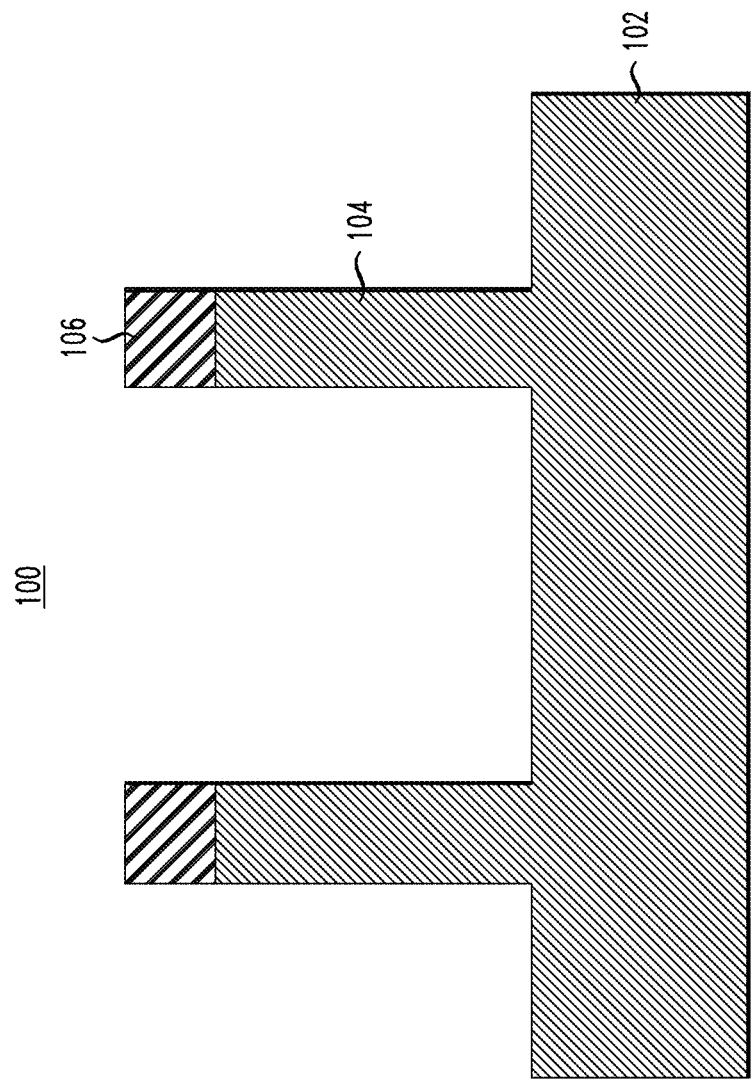
FIG. 1 is a cross-sectional view illustrating fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to forming VFETs with bottom spacer structures which have self-aligned bottom source/drain junctions having a uniform effective gate length.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments of the present invention, a bottom spacer pattern for VFETs is formed using first and second bottom spacer formations. The first spacers of the bottom spacer pattern have flat profiles adjacent source/drain junction surfaces. More specifically, surfaces of the first spacers which are adjacent source/drain junction regions have a flat or planar profile. The flat profile of the first spacers is achieved by removing a sacrificial epitaxial layer from on top of a bottom source/drain layer, followed by deposition of a first spacer material. The deposition results in the first spacer material being pinched-off, resulting in first spacer material filling in open areas adjacent bottom source/junctions under lower portions of the fins. The pinched off areas of the first spacer material have a flat or planar profile adjacent bottom source/drain junction surfaces.

The overall structure of the bottom spacer includes a combination of the first spacer having the flat profile with a second spacer having a concave meniscus-like profile formed adjacent the first spacer. The techniques to form the resulting structure include formation of a self-aligned bottom source/drain junction resulting in a uniform effective gate length, which is immune to process variations.

The cross-sections in FIGS. 1-13 are taken perpendicular to the length of the fins along the substrate.

FIG. 1 is a cross-sectional view illustrating fin formation in a method of manufacturing a semiconductor device 100, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-VI compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 104, can be formed by patterning a portion of the semiconductor substrate 102 or a semiconductor layer on the substrate 102 into the fins 104. According to an embodiment, a hardmask 106 including, for example, a dielectric material, such as silicon nitride (SiN) is formed on portions of the semiconductor layer that are to be formed into the fins 104. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. FIG. 1 illustrates two fins 104 on the substrate 102. Although two fins 104 are shown in the figures for ease of explanation, more than two fins can be formed.

Figure 2:
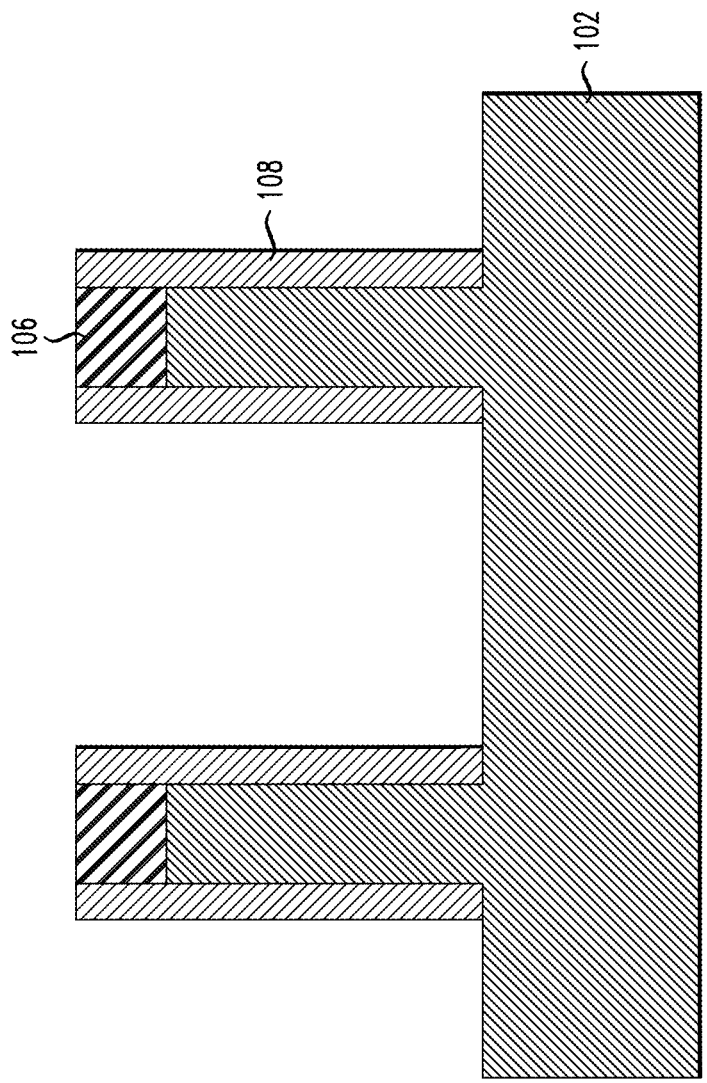
FIG. 2 is a cross-sectional view illustrating deposition and patterning of sacrificial spacer layers in a method of manufacturing a semiconductor device, according to an exemplary embodiment of the present invention.

FIG. 2 is a cross-sectional view illustrating deposition and patterning of sacrificial spacer layers in a method of manufacturing a semiconductor device, according to an exemplary embodiment of the present invention. Referring to FIG. 2, a dielectric layer is deposited on the fins 104, hardmasks 106 and on exposed surfaces of the substrate 102, and portions of the dielectric layer are removed to form sacrificial spacer layers 108 remaining on the vertical surfaces of each of the fins 104 and hardmasks 106. For example, horizontal portions of the dielectric layer are removed in an ME process. The ME process can be performed using, for example, $CH_4$, $CHF_3$, or $CH_2F_2$ chemistry. In accordance with an embodiment of the present invention, the dielectric layer comprises for example, SiN, silicon boron nitride (SiBN), siliconborocarbonitride (SiBCN) or some other dielectric, and has a thickness of about 2 nm to about 10 nm.

The dielectric layer is deposited on the fins 104, hardmasks 106 and on exposed surfaces of the substrate 102 using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 3:
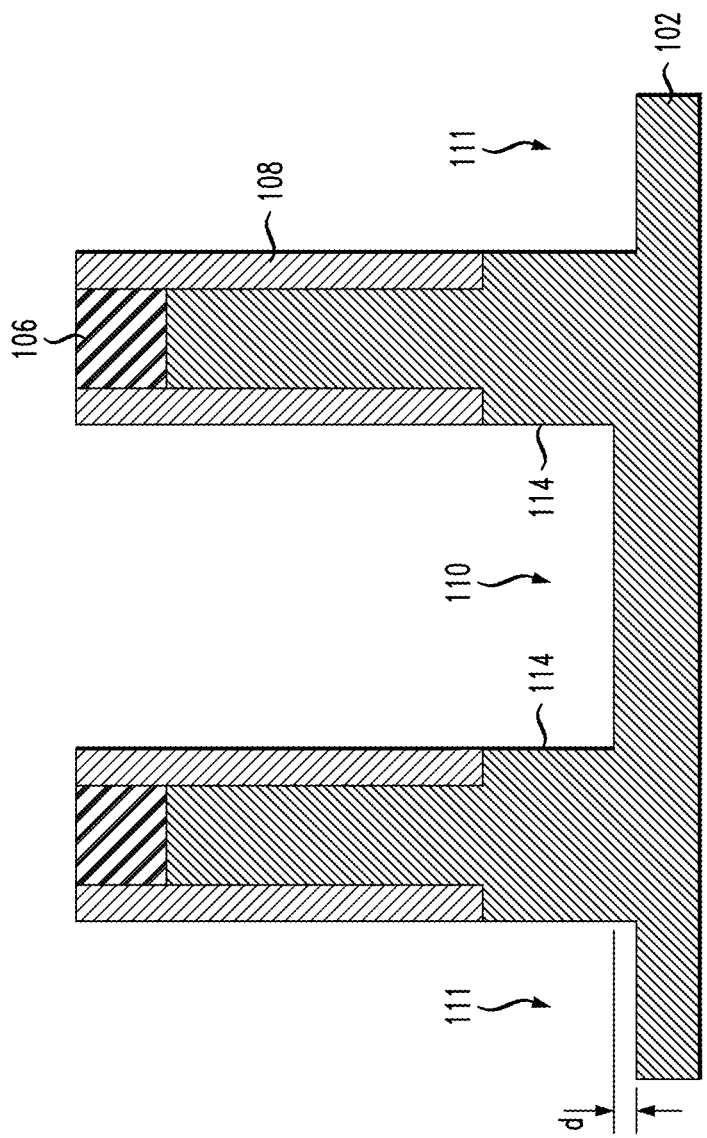
FIG. 3 is a cross-sectional view illustrating recessing of portions of a semiconductor substrate to form recessed regions in a method of manufacturing a semiconductor device, according to an exemplary embodiment of the present invention.

FIG. 3 is a cross-sectional view illustrating recessing of portions of a semiconductor substrate to form recessed regions in a method of manufacturing a semiconductor device, according to an exemplary embodiment of the present invention. Referring to FIG. 3, portions of the substrate 102 not covered by the hardmasks 106, and the spacers 108 are recessed to form recessed regions 110 and 111. In one or more embodiments of the present invention, the depth of the recessed regions 111 differs from the depth of the recessed region 110 due to, for example, fin pitch and/or RIE process loading effects. The difference in depth is represented by element d in FIG. 3. The difference in depth d can be in the range of about 2 nm to about 15 nm. The recessing of the substrate 102 leaves pedestal portions 114 aligned under the spacer and fin structures, each pedestal portion 114 having width of the fin 104 plus the width of the spacers 108 alongside each fin 104. The recessing of the substrate 102 is performed using directional RIE with fluorine or chlorine-based gases.

Figure 4:
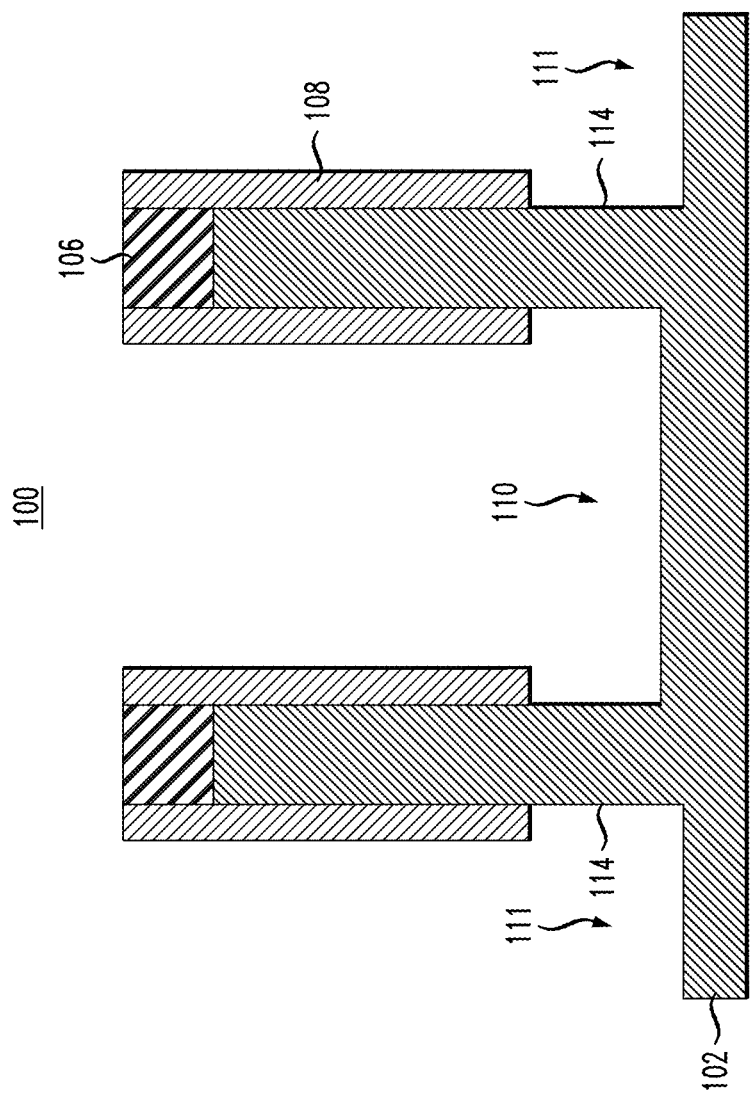
FIG. 4 is a cross-sectional view illustrating lateral removal of portions of the substrate under fins adjacent the recessed regions in a method of manufacturing a semiconductor device, according to an exemplary embodiment of the present invention.

FIG. 4 is a cross-sectional view illustrating lateral removal of portions of the substrate under fins adjacent the recessed regions in a method of manufacturing a semiconductor device, according to an exemplary embodiment of the present invention. Referring to FIG. 4, following the recessing described in connection with FIG. 3, the pedestal portions 114 are trimmed to a width substantially the same or the same as a width of the fins 104 using, for example, an isotropic etch process. For example, a width of the fins 104 and the trimmed pedestal portions 114 may be in the range of about 4 nm to about 20 nm.

In the case of isotropic etching, the pedestal portions 114 are trimmed to the desired width using for example, a suitable etch process selective to dielectric materials such as the fin hardmasks 106 and the material of the spacers 108 on fin sidewalls. In some embodiments, the etch is an isotropic process such as plasma etch, gas phase etch (e.g., hydrogen chloride (HCl)), or wet etch.

Figure 5:
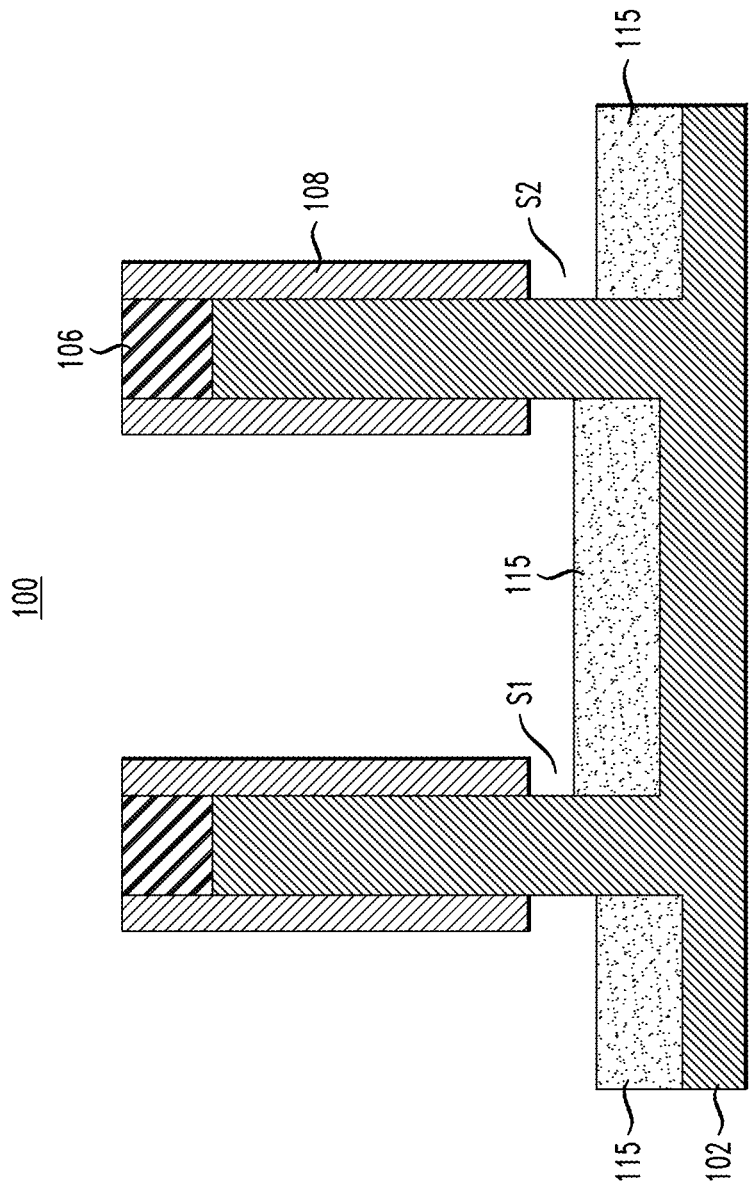
FIG. 5 is a cross-sectional view illustrating epitaxial growth of bottom source/drain regions in a method of manufacturing a semiconductor device, according to an exemplary embodiment of the present invention.

FIG. 5 is a cross-sectional view illustrating epitaxial growth of bottom source/drain regions in a method of manufacturing a semiconductor device, according to an exemplary embodiment of the present invention. Referring to FIG. 5, bottom source/drain regions 115 are formed in the recessed portions 110 and 111 of the substrate 102 and around the pedestal portions 114. In one or more embodiments, the bottom source/drain regions 115 are formed by a bottom-up epitaxial growth process. The epitaxially grown bottom source/drain regions 115 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. The bottom source/drain regions 115 can be p-type or n-type. As shown in FIG. 5, heights of the bottom source/drain regions 115 do not reach the bottom surfaces of the sacrificial spacer layers 108, so that spaces S1 and S2 remain between top surfaces of the bottom source/drain regions 115 and bottom surfaces of the sacrificial spacer layers 108. The spaces S1 and S2 can be in the range of about 2 nm to about 20 nm.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 6:
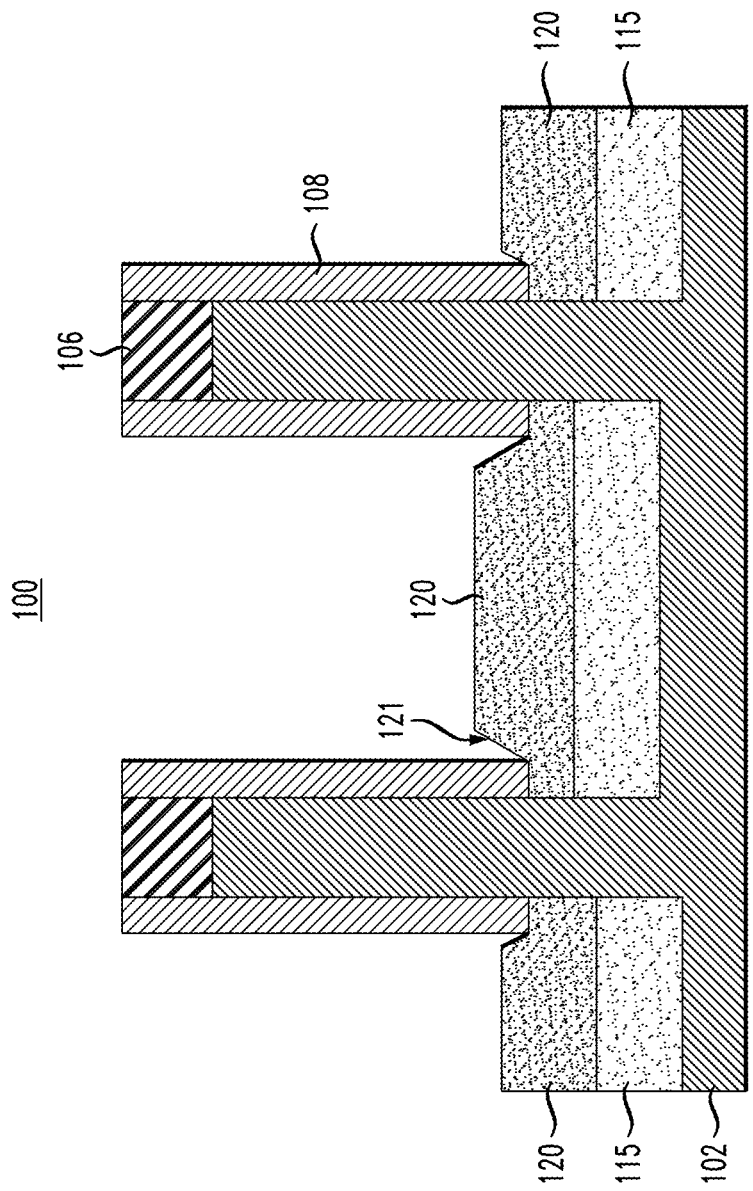
FIG. 6 is a cross-sectional view illustrating epitaxial growth of sacrificial epitaxial layers on the bottom source/drain regions in a method of manufacturing a semiconductor device, according to an exemplary embodiment of the present invention.

FIG. 6 is a cross-sectional view illustrating epitaxial growth of sacrificial epitaxial layers on the bottom source/drain regions in a method of manufacturing a semiconductor device, according to an exemplary embodiment of the present invention. Referring to FIG. 6, sacrificial epitaxial layers 120 are formed on the bottom source/drain regions 115 in the recessed portions 110 and 111 of the substrate 102 and in the spaces Si and S2 between top surfaces of the bottom source/drain regions 115 and bottom surfaces of the sacrificial spacer layers 108. In one or more embodiments, the sacrificial epitaxial layers 120 are formed by a bottom-up epitaxial growth process, and have a higher germanium concentration than the bottom source/drain regions 115. By way of example, if the bottom source/drain regions 115 include Si:P or Si:As for an n-type FET (nFET), the sacrificial epitaxial layers 120 include SiGe:P or SiGe:As for an nFET, and if the bottom source/drain regions 115 include SiGe:B for a p-type FET (pFET), the sacrificial epitaxial layers 120 include SiGe:B with a higher germanium concentration for a pFET. The difference in germanium concentration between the bottom source/drain regions 115 and the sacrificial epitaxial layers 120 can be in the range of about 20 atomic percentage to about 50 atomic percentage.

Similar to the epitaxially grown bottom source/drain regions 115, the sacrificial epitaxial layers 120 can be in-situ doped, or doped using the alternative doping techniques described herein above. Dopants may include the dopants described herein above at the same or similar concentrations. As shown in FIG. 6, the sacrificial epitaxial layers 120 can include facets 121 (e.g., {111} facets) formed adjacent lateral sides of the sacrificial spacer layers 108.

Figure 7:
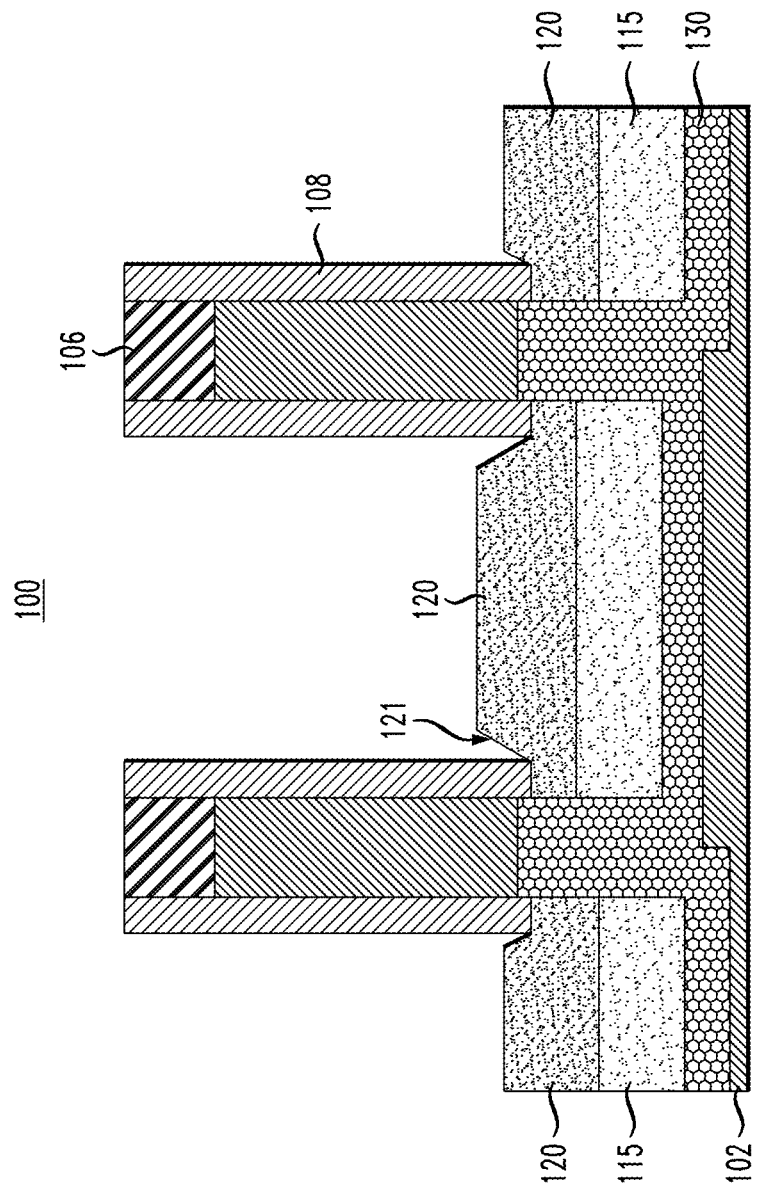
FIG. 7 is a cross-sectional view illustrating bottom source/drain junction formation in a method of manufacturing a semiconductor device, according to an exemplary embodiment of the present invention.

FIG. 7 is a cross-sectional view illustrating bottom source/drain junction formation in a method of manufacturing a semiconductor device, according to an exemplary embodiment of the present invention. Referring to FIG. 7, bottom source/drain junction regions 130 between the bottom source/drain regions 115 and the fins 104 are formed by an annealing process which causes dopant diffusion. More specifically, the doped bottom source/drain junction regions 130 are formed by dopant diffusion from the bottom source/drain regions 115 and the sacrificial epitaxial layers 120 into the pedestal portions 114, lower portions of the fins 104 and parts of the substrate 102 under the bottom source/drain regions 115 and pedestal portions 114. The annealing process can be, for example, a drive-in annealing process performed at temperatures in the range of, for example, about 800° C. to 1300° C. and for durations in the range of, for example, about 0.01 seconds to 10 minutes.

Figure 8:
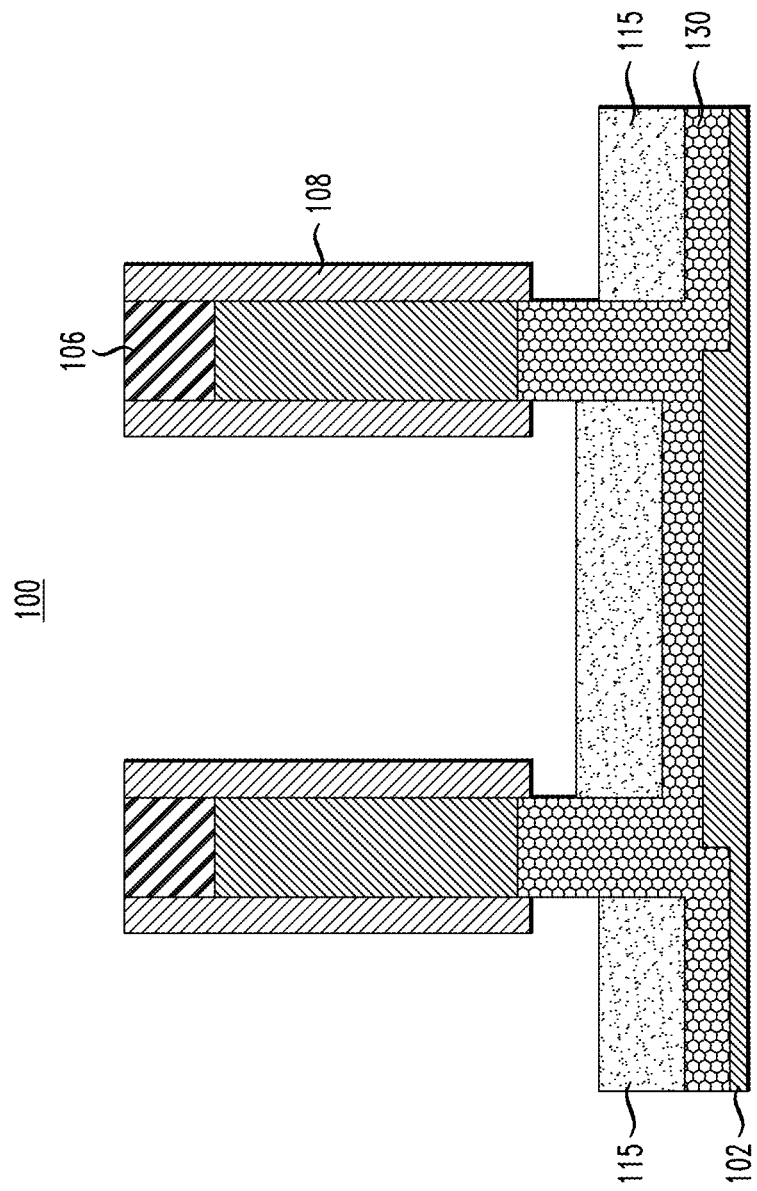
FIG. 8 is a cross-sectional view illustrating selective removal of the sacrificial epitaxial layers in a method of manufacturing a semiconductor device, according to an exemplary embodiment of the present invention.

FIG. 8 is a cross-sectional view illustrating selective removal of the sacrificial epitaxial layers in a method of manufacturing a semiconductor device, according to an exemplary embodiment of the present invention. Referring to FIG. 8, after junction annealing to form the bottom source/drain junctions 130 described in connection with FIG. 7, the sacrificial epitaxial layers 120 are selectively removed with respect to the hardmasks 106 and sacrificial spacer layers 108, using for example, a selective etch process. The selective etch process can include, for example, diluted hydrogen chloride (HCl) gas. Top surfaces of the bottom source/drain regions 115 are exposed after the selective removal of the sacrificial epitaxial layers 120.

Figure 9:
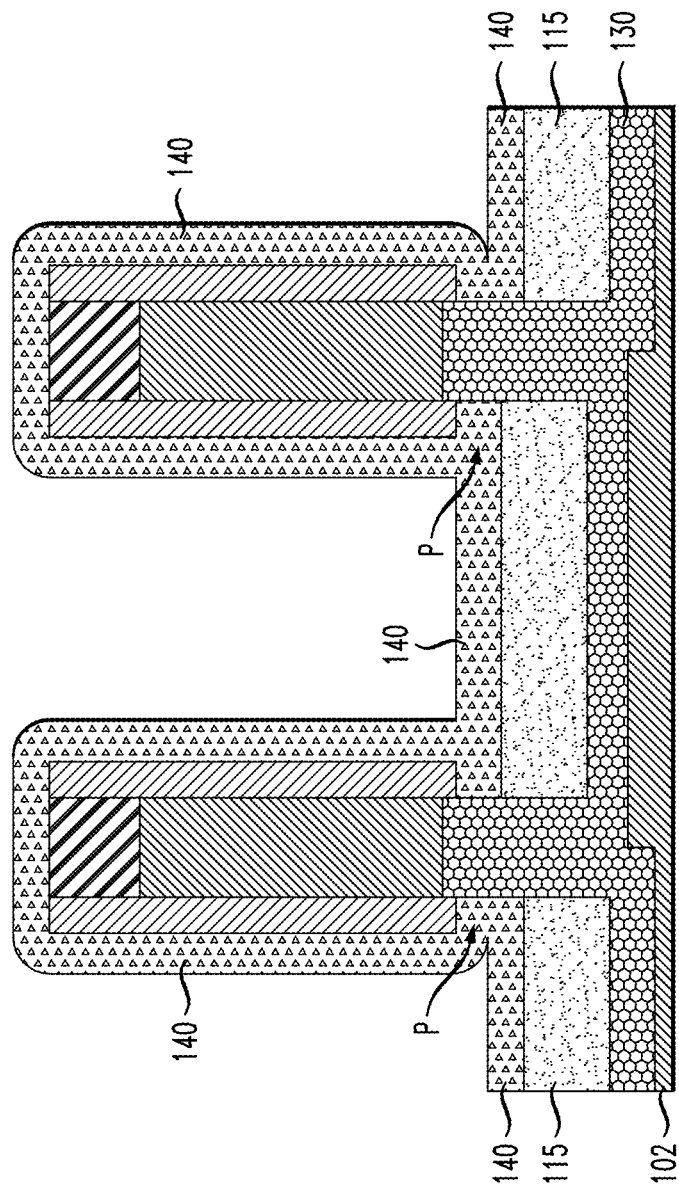
FIG. 9 is a cross-sectional view illustrating deposition of first bottom spacer material in a method of manufacturing a semiconductor device, according to an exemplary embodiment of the present invention.

FIG. 9 is a cross-sectional view illustrating deposition of first bottom spacer material in a method of manufacturing a semiconductor device, according to an exemplary embodiment of the present invention. Referring to FIG. 9, a first bottom spacer material layer 140 is conformally deposited on exposed portions of the bottom source/drain region 115, the bottom source/drain junction region 130 and on and around the fins 104 including the hardmasks and sacrificial spacer layers 108 thereon. The first bottom spacer material layer 140 is conformally deposited using, for example, one or more deposition techniques including, but not necessarily limited to, CVD, PECVD, RFCVD, PVD, ALD, MLD, MBD, PLD, LSMCD, sputtering, and/or plating. In accordance with an embodiment of the present invention, the first bottom spacer material layer 140 comprises for example, silicon oxide ($SiO_x$), where x is, for example, 2 in the case of silicon dioxide ($SiO_2$), or 1.99 or 2.01, silicon oxycarbide (SiOC), silicon oxycarbonitride (SiOCN) or some other dielectric.

Due to the conformal nature of the deposition, the first bottom spacer material layer 140 is pinched off at areas P where opposing surfaces on which the first bottom spacer material layer 140 are deposited are in relatively close proximity. Referring to back to FIG. 5, the pinched off areas P correspond to the areas where the spaces S1 and S2 between top surfaces of the bottom source/drain regions 115 and bottom surfaces of the sacrificial spacer layers 108 were located. Spaces between the top surfaces of the source/drain regions 115 and the bottom surfaces of the sacrificial spacer layers 108 reemerge after the selective removal of the sacrificial epitaxial layers 120 discussed in connection with FIG. 8, and are filled in by the bottom spacer material layer 140 as shown in FIG. 9.

Figure 10:
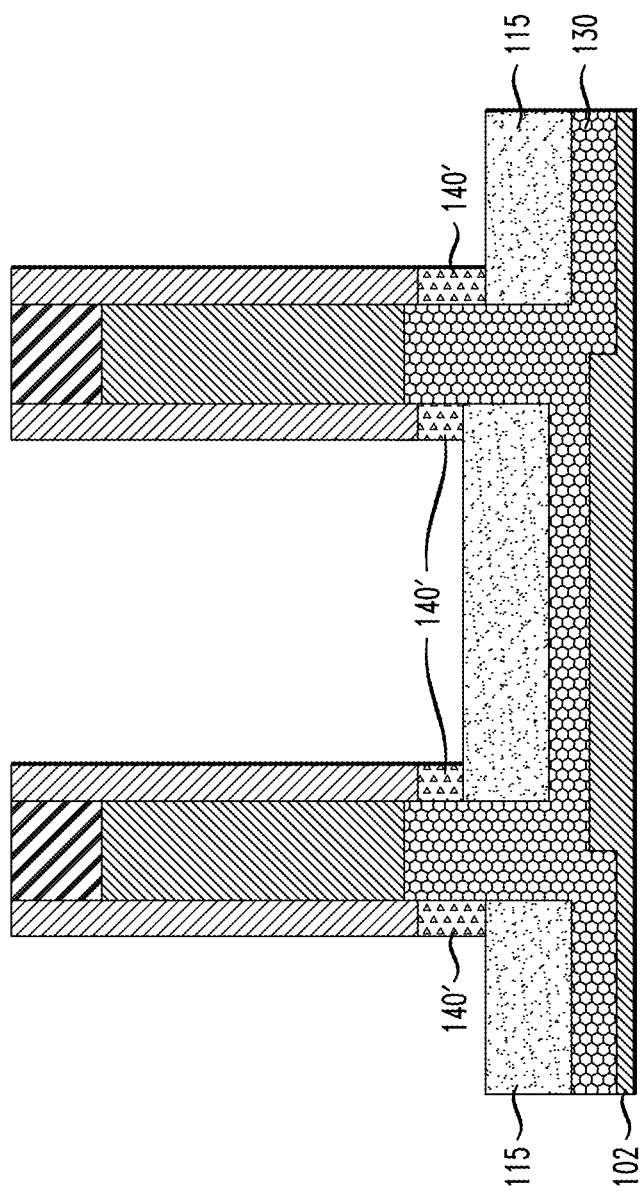
FIG. 10 is a cross-sectional view illustrating patterning of first bottom spacer material into first bottom spacers in a method of manufacturing a semiconductor device, according to an exemplary embodiment of the present invention.

FIG. 10 is a cross-sectional view illustrating patterning of first bottom spacer material into first bottom spacers in a method of manufacturing a semiconductor device, according to an exemplary embodiment of the present invention. Referring to FIG. 10, exposed portions of the first bottom spacer material layer 140 are removed in an etchback process, leaving first bottom spacers 140' under bottom surfaces of the sacrificial spacer layers 108 and on top surfaces of the source/drain regions 115. The first spacers 140' are formed against upper portions of the source/drain junctions 130 under the fins 104, and have a flat profile (e.g., planar, non-curved sides) after etchback due to the first bottom spacer material layer 140 being pinched off at areas P during deposition of the first spacer material 140, and due to the top surfaces of the first spacers 140' being covered by the sacrificial spacers layers 108 during the etchback process. As a result, the first spacers 140' lack the concave meniscus-like shaped corners of spacers formed by conventional methods. The etchback process of the first bottom spacer material layer 140 is performed using, for example, diluted hydrofluoric acid.

Figure 11:
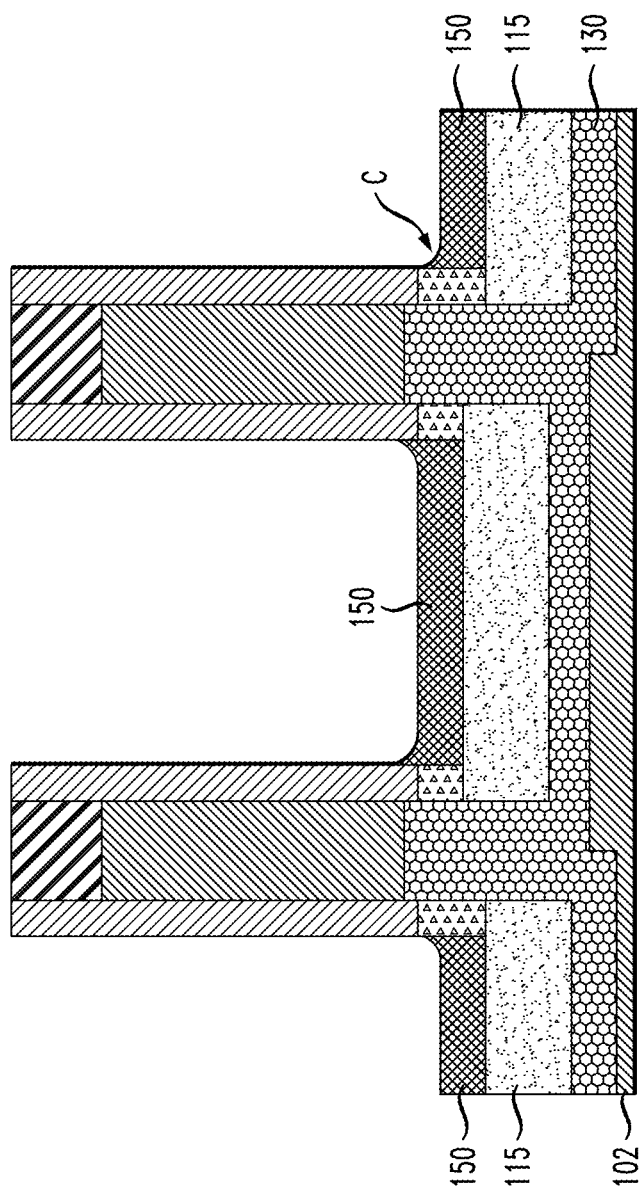
FIG. 11 is a cross-sectional view illustrating second bottom spacer formation in a method of manufacturing a semiconductor device, according to an exemplary embodiment of the present invention.

FIG. 11 is a cross-sectional view illustrating second bottom spacer formation in a method of manufacturing a semiconductor device, according to an exemplary embodiment of the present invention. Referring to FIG. 11, second bottom spacers 150 are formed on exposed portions of the bottom source/drain region 115, adjacent the first bottom spacers 140'. A second bottom spacer material layer is deposited using a combination of conformal and directional deposition using, for example, one or more deposition techniques including, but not necessarily limited to, high density plasma (HDP), gas cluster ion beam (GCIB), CVD, PECVD, RFCVD, PVD, ALD, MLD, MBD, PLD, LSMCD, sputtering, and/or plating, followed by an etchback process to form the second bottom spacers 150. In accordance with an embodiment of the present invention, the second bottom spacers 150 comprise for example, the same material as the first spacers 140', such as, for example, $SiO_x$, SiOC, SiOCN or some other dielectric. Alternatively, the second bottom spacers comprise for example, a different material from the first spacers 140', as long the sacrificial spacer layers 108 can be selectively removed with respect to the first and second spacers 140' and 150.

As can be seen in FIG. 11, after etchback of the second bottom spacer material layer to result in the second bottom spacers 150, the resulting second bottom spacers 150 have concave meniscus-like shaped corners C where the second bottom spacers 150 abut the first bottom spacers 140' and/or lower portions of the sacrificial spacer layers 108. In this case, due to the presence of the first spacers 140' between the bottom source/drain junctions 130 and the second spacers 150, the concave meniscus-like shaped corners C are spaced apart from the source/drain junctions 130 by the first spacers 140' having the flat profiles. As a result, the concave meniscus-like shaped corners C of the second bottom spacers 150 do not impact control of bottom source/drain junction settings and do not cause unwanted device variability.

Figure 12:
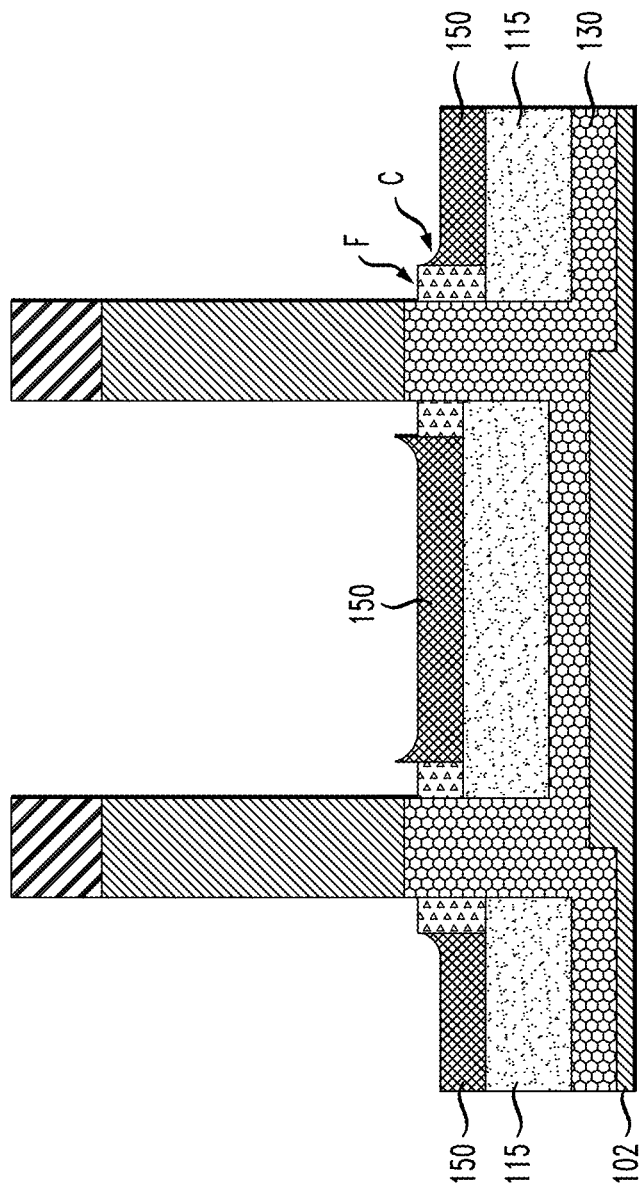
FIG. 12 is a cross-sectional view illustrating removal of the sacrificial spacer layers in a method of manufacturing a semiconductor device, according to an exemplary embodiment of the present invention.

FIG. 12 is a cross-sectional view illustrating removal of the sacrificial spacer layers in a method of manufacturing a semiconductor device, according to an exemplary embodiment of the present invention. Referring to FIG. 12, the sacrificial spacer layers 108 are selectively removed with respect to the first and second spacers 140' and 150. The selective removal is performed using for example, hot phosphoric acid ($H_3PO_4$). As can be seen in FIG. 12, in contrast to the concave meniscus-like shaped corners C, the top surfaces F of the first spacers 140', which are adjacent the source/drain junctions 130, have flat or planar profiles and do not have curved corners where the surfaces F, which extend parallel to the substrate, meet or abut the source/drain junctions 130.

Figure 13:
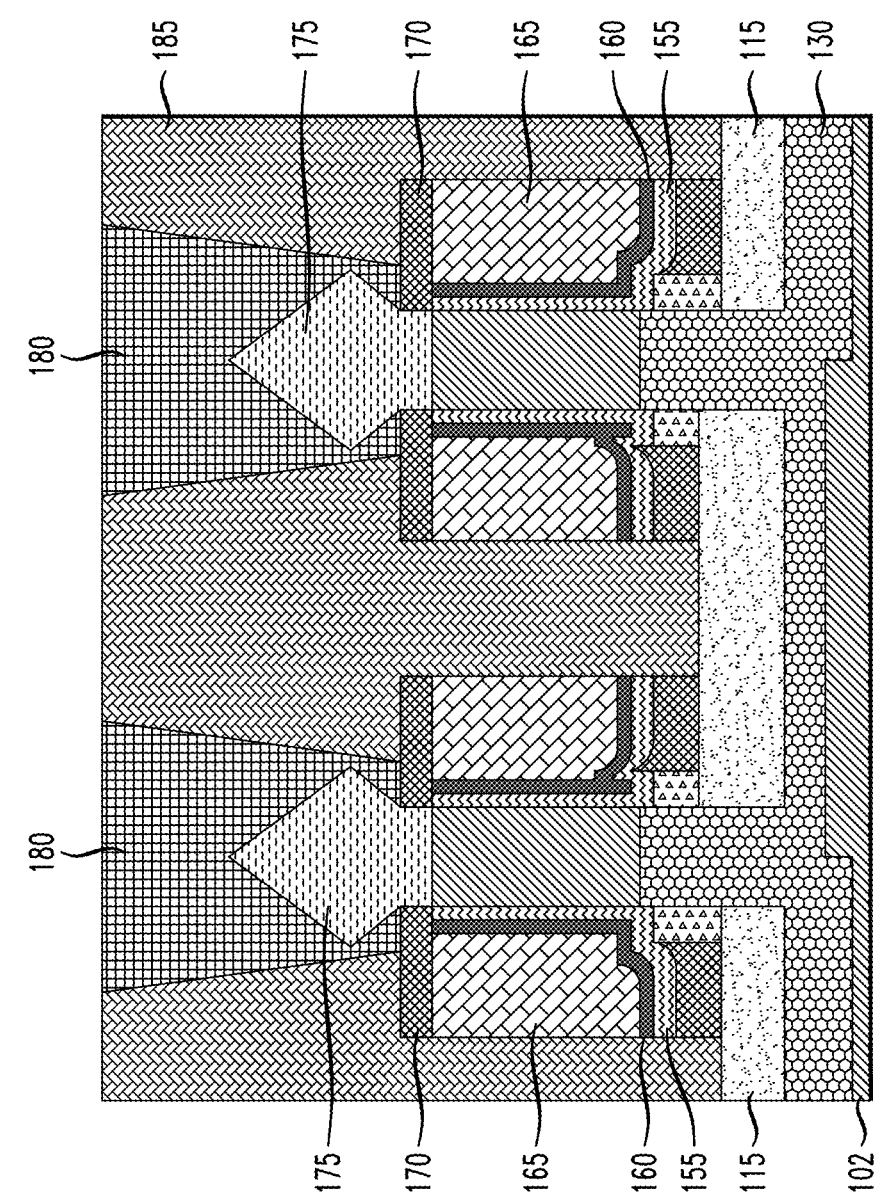
FIG. 13 is a cross-sectional view illustrating high-k dielectric layer, WFM layer, gate metal layer, top spacer layer, inter-level dielectric (ILD), top source/drain and source/drain contact formation in a method of manufacturing a semiconductor device, according to an exemplary embodiment of the present invention.

FIG. 13 is a cross-sectional view illustrating high-k dielectric layer, WFM layer, gate metal layer, top spacer layer, inter-level dielectric (ILD), top source/drain and source/drain contact formation in a method of manufacturing a semiconductor device, according to an exemplary embodiment of the present invention. Referring to FIG. 13, following removal of the sacrificial spacer layers 108, gate metal layers 165 and WFM layers 160 are formed on high-k dielectric layers 155. The high-k dielectric layers 155 include, for example, a high-k material including, but not necessarily limited to, HfO$_2$ (hafnium oxide), ZrO$_2$ (zirconium dioxide), hafnium zirconium oxide Al$_2$O$_3$ (aluminum oxide), and Ta$_2$O$_5$ (tantalum pentoxide). The WFM and high-k dielectric layers 160 and 155 are conformally deposited on the first and second bottom spacers 140' and 150 and on and around the fins 104 including the hardmasks 106 thereon.

The WFM layers 160 are deposited on the high-k dielectric layers 155 and include, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN.

The gate metal layers 165 are deposited on the WFM layers 160 and include, for example, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate metal, WFM and high-k gate dielectric layers 165, 160 and 155 are deposited using, for example, deposition techniques including, but not limited to, CVD, PECVD, RFCVD, PVD, ALD, MLD, MBD, PLD, LSMCD, sputtering, and/or plating. An isotropic etch is performed to recess the gate structure, including the gate metal, WFM and high-k gate dielectric layers 165, 160 and 155.

A top spacer layer 170 is formed on the recessed gate structure, including the gate metal, WFM and high-k gate dielectric layers 165, 160 and 155, and on and around the fins 104 including the hardmasks 106 thereon. The top spacer layer 170 includes, for example, SiN, SiBN, SiBCN, SiOCN or other dielectric. According to an embodiment of the present invention, the top spacer layer 170 is conformally deposited using, for example, deposition techniques including, but not limited to, CVD, PECVD, RFCVD, PVD, ALD, MLD, MBD, PLD, LSMCD, sputtering, and/or plating.

A dielectric material, including, but not limited to SiO$_x$, low temperature oxide (LTO), high temperature oxide (HTO), flowable oxide (FOX) or some other dielectric, is deposited to form an ILD layer 185 on the recessed gate structures, including the top spacers 170 thereon. The ILD layer 185 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from layer 185 and planarize the resulting structure. The planarization can be performed down to the hardmasks 106 on the fins 104. In accordance with an embodiment of the present invention, the ILD layer 185 electrically isolates different transistors from each other.

The hardmasks 106 are selectively removed, using for example, a selective etch process. The selective etch process can include, for example, fluorinated gas (such as SF$_6$, CH$_4$, or CHF$_3$) based dry etching or hot phosphoric acid (H$_3$PO$_4$) etching. Then, upper portions of the ILD layer 185 are removed using, for example, another selective etching process, such as a selective oxide etch using, for example, F/NH$_3$ based dry etching. The removal of the upper portions of the ILD layer 185 exposes upper portions of the fins 104 so that top source/drain regions 175 can be epitaxially grown.

The top source/drain regions 175 are epitaxially grown in epitaxial growth processes from the upper portions of the fins 104. The epitaxially grown top source/drain regions 175 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of P, As and Sb, and a p-type dopant selected from a group of B, Ga, In, and Tl at various concentrations. For example, in a non-limiting example, a dopant concentration range may be $1\times10^{18}/cm^3$ to $1\times10^{21}/cm^3$.

Following top source/drain region 175 formation, ILD material is again deposited to form the remainder of the ILD layer 185 over the source/drain regions 175 and to fill in gaps between the top source/drain regions 175. The ILD material is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Trenches are respectively opened in the ILD layer 185 over the top source/drain regions 175 using, for example, lithography followed by RIE. Contacts to top source/drain regions 175 are formed in the trenches by filling the trenches with contact material layers 180, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on the top source/drain regions 175 and on side and bottom surfaces of the trenches before filling the trenches with the contact material layers 180. Deposition of the contact material layers 180 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a vertical transistor comprising a source/drain junction region on a semiconductor substrate;
bottom source/drain regions disposed adjacent the source/drain junction region; and
a bottom spacer pattern comprising first bottom spacers disposed on lateral sides of the source/drain junction region, and second bottom spacers disposed on lateral sides of the first bottom spacers;
wherein the first and second bottom spacers are formed on top surfaces of the bottom source/drain regions;
wherein top surfaces of the first bottom spacers have a planar profile, and top surfaces of the second bottom spacers have a concave shape; and
wherein the top surfaces of respective ones of the bottom source/drain regions on the lateral sides of the source/ drain junction region are at different heights along the source/drain junction region.

2. The semiconductor device according to claim 1, further comprising a gate structure disposed on the bottom spacer pattern, wherein the gate structure comprises a dielectric layer and at least one metal layer.

3. The semiconductor device according to claim 2, wherein a shape of the dielectric layer conforms to shapes of the top surfaces of the first and second bottom spacers.

4. The semiconductor device according to claim 2, wherein the dielectric layer contacts the top surfaces of the first and second bottom spacers.

5. The semiconductor device according to claim 4, wherein the dielectric layer further contacts a portion of the source/drain junction region.

6. The semiconductor device according to claim 2, wherein a shape of the at least one metal layer conforms to shapes of the top surfaces of the first and second bottom spacers.

7. The semiconductor device according to claim 1, wherein the first bottom spacers are disposed between the source/drain junction region and the second bottom spacers.

8. The semiconductor device according to claim 1, wherein at least part of the top surfaces of the first bottom spacers are at different heights than at least part of the top surfaces of the second bottom spacers.

9. The semiconductor device according to claim 1, wherein a width of the first bottom spacers along the top surfaces of the bottom source/drain regions is less than a width of the second bottom spacers along the top surfaces of the bottom source/drain regions.

10. A semiconductor device, comprising:
a vertical channel region comprising a source/drain junction region at a bottom portion of the vertical channel region;
bottom source/drain regions disposed adjacent the source/drain junction region; and
a bottom spacer pattern comprising first bottom spacers disposed on sides of the source/drain junction region, and second bottom spacers disposed on sides of the first bottom spacers;
wherein the first and second bottom spacers are formed on top surfaces of the bottom source/drain regions;
wherein top surfaces of the first bottom spacers have a planar profile, and a portion of top surfaces of the second bottom spacers have a concave shape; and
wherein the top surfaces of respective ones of the bottom source/drain regions on the sides of the source/drain junction region are at different heights along the source/drain junction region.

11. The semiconductor device according to claim 10, further comprising a gate structure disposed on the bottom spacer pattern, wherein the gate structure comprises a dielectric layer and at least one metal layer.

12. The semiconductor device according to claim 11, wherein a shape of the dielectric layer conforms to shapes of the top surfaces of the first and second bottom spacers.

13. The semiconductor device according to claim 11, wherein the dielectric layer contacts the top surfaces of the first and second bottom spacers.

14. The semiconductor device according to claim 13, wherein the dielectric layer further contacts a portion of the source/drain junction region.

15. The semiconductor device according to claim 11, wherein a shape of the at least one metal layer conforms to shapes of the top surfaces of the first and second bottom spacers.

16. The semiconductor device according to claim 10, wherein the first bottom spacers are disposed between the source/drain junction region and the second bottom spacers.

17. The semiconductor device according to claim 10, wherein at least part of the top surfaces of the first bottom spacers are at different heights than at least part of the top surfaces of the second bottom spacers.

18. The semiconductor device according to claim 10, wherein a width of the first bottom spacers along the top surfaces of the bottom source/drain regions is less than a width of the second bottom spacers along the top surfaces of the bottom source/drain regions.

19. A semiconductor device, comprising:
a fin comprising a source/drain junction region at a bottom portion of the fin;
bottom source/drain regions disposed adjacent the source/drain junction region; and
a bottom spacer pattern comprising first bottom spacers disposed on sides of the source/drain junction region, and second bottom spacers disposed on sides of the first bottom spacers;
wherein the first and second bottom spacers are formed on top surfaces of the bottom source/drain regions;
wherein top surfaces of the first bottom spacers have a planar profile, and a portion of top surfaces of the second bottom spacers have a concave shape; and
wherein the top surfaces of respective ones of the bottom source/drain regions on the sides of the source/drain junction region are at different heights along the source/drain junction region.

20. The semiconductor device according to claim 19, wherein the first bottom spacers are disposed between the source/drain junction region and the second bottom spacers.

* * * * *